United States Patent
Nakagawa

(10) Patent No.: US 9,814,141 B2
(45) Date of Patent: Nov. 7, 2017

(54) CONNECTION STRUCTURE OF CONDUCTORS AND DISPLAY APPARATUS

(71) Applicant: Sakai Display Products Corporation, Sakai-shi, Osaka (JP)

(72) Inventor: Hidetoshi Nakagawa, Sakai (JP)

(73) Assignee: Sakai Display Products Corporation, Sakai-shi, Osaka (JP)

(*) Notice: Subject to any disclaimer, the term of this patent is extended or adjusted under 35 U.S.C. 154(b) by 1 day.

(21) Appl. No.: 14/917,225

(22) PCT Filed: Sep. 3, 2014

(86) PCT No.: PCT/JP2014/073216
§ 371 (c)(1),
(2) Date: Mar. 7, 2016

(87) PCT Pub. No.: WO2015/037496
PCT Pub. Date: Mar. 19, 2015

(65) Prior Publication Data
US 2016/0205779 A1 Jul. 14, 2016

(30) Foreign Application Priority Data
Sep. 10, 2013 (JP) ................. 2013-187546

(51) Int. Cl.
*H05K 1/14* (2006.01)
*H05K 1/02* (2006.01)
(Continued)

(52) U.S. Cl.
CPC ......... *H05K 1/144* (2013.01); *H01R 13/2414* (2013.01); *H05K 1/0298* (2013.01);
(Continued)

(58) Field of Classification Search
CPC .. H05K 2203/0278; H05K 3/323; H05K 1/14; H05K 1/144
See application file for complete search history.

(56) References Cited

U.S. PATENT DOCUMENTS

| | | | |
|---|---|---|---|
| 2004/0108132 A1 | 6/2004 | Ohazama | |
| 2005/0098902 A1* | 5/2005 | Ho | H05K 1/117 257/786 |
| 2005/0211464 A1* | 9/2005 | Byun | H01L 24/29 174/259 |

FOREIGN PATENT DOCUMENTS

| | | |
|---|---|---|
| JP | S62-088393 A | 4/1987 |
| JP | 2004-184805 A | 7/2004 |
| JP | 5281762 B2 | 9/2013 |

OTHER PUBLICATIONS

English translation of the International Search Report for PCT/JP2014/073216 dated Sep. 30, 2014, 1 page.

* cited by examiner

*Primary Examiner* — Jeremy C Norris
(74) *Attorney, Agent, or Firm* — Rudy J. Ng; Bret E. Field; Bozicevic, Field & Francis LLP

(57) ABSTRACT

The present invention provides a connection structure of conductors in which, when connecting a pair of conductors facing each other using an anisotropic conductive film containing conductive particles dispersed therein, a short circuit between the adjacent conductors due to a movement of conductive particles is be prevented, and a display apparatus having the connection structure of conductors. When executing thermo-compression bonding processing while interposing the anisotropic conductive film, even if conductive particles dispersed in the anisotropic conductive film are concentrated and continued in a gap between adjacent first terminals, in the vicinity of an edge of an interlayer insulation film, since a distance between the first terminals adja- (Continued)

cent to each other is increased due to notches formed therein, the first terminals adjacent to each other are not short-circuited.

7 Claims, 6 Drawing Sheets

(51) Int. Cl.
*H05K 1/11* (2006.01)
*H01R 13/24* (2006.01)
*H05K 3/32* (2006.01)
*H01R 12/70* (2011.01)

(52) U.S. Cl.
CPC ............... *H05K 1/11* (2013.01); *H05K 1/111* (2013.01); *H05K 3/323* (2013.01); *H01R 12/7076* (2013.01); *H05K 2201/0314* (2013.01); *H05K 2201/10128* (2013.01); *Y02P 70/611* (2015.11)

F I G. 1
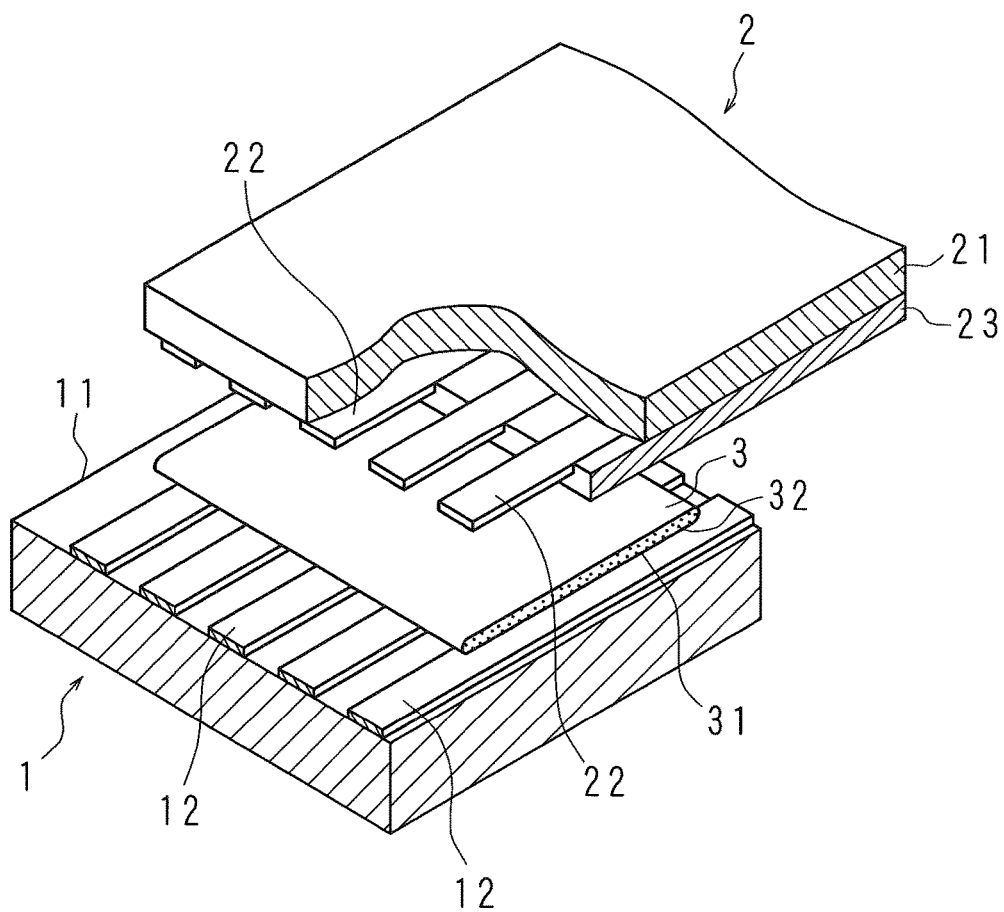

CONNECTION STRUCTURE OF CONDUCTORS AND DISPLAY APPARATUS

CROSS-REFERENCE TO RELATED APPLICATIONS

This application is the national phase under 35 U.S.C. §371 of PCT International Application No. PCT/JP2014/073216 which has an International filing date of Sep. 3, 2014 and designated the United States of America.

FIELD

The present invention relates to a connection structure of conductors in which a plurality of conductors arranged in parallel on one side and a plurality of conductors arranged in parallel on the other side are connected by an anisotropic conductive film containing conductive particles dispersed therein, and a display apparatus having the connection structure of conductors.

BACKGROUND

As a method of connecting conductors such as a pair of corresponding conductive layers, a method of using an anisotropic conductive film has been known in the art. The anisotropic conductive film has a configuration in which conductive particles such as metal particles or plastic particles coated with metal are dispersed in an insulating adhesive such as a thermoplastic resin or a thermosetting resin. In a state in which a pair of conductors to be connected are positioned, the pair of corresponding conductors are connected by thermo-compression bonding processing, while interposing the anisotropic conductive film therebetween.

In the above-described connection method using the anisotropic conductive film, an electrical connection between the pair of conductors facing each other is obtained through the conductive particles, but in a region in which the pair of conductors do not face each other, insulation is maintained. Thereby, the conductors facing each other are electrically connected, but the conductors adjacent thereto are electrically insulated from each other.

Therefore, when the respective pair of corresponding conductors (for example, the respective corresponding conductive layers) are individually connected to a pair of supports in which a plurality of conductors are arranged in parallel, respectively (for example, a pair of substrates in which a plurality of conductive layers are formed by patterning, respectively), the connection method using the anisotropic conductive film is extremely useful. Further, a configuration, in which a tape carrier package (TCP) having ICs mounted on a film substrate thereof or a chip on film (COF) is connected to terminals of a display panel using the anisotropic conductive film to be mounted thereon, is generally used.

Japanese Patent Laid-Open Publication No. 2004-184805 discloses a connection structure of connecting a pair of corresponding conductive wirings, while interposing an anisotropic conductive film between the pair of conductive wirings.

SUMMARY

In the connection method using the anisotropic conductive film, since an adhesive which is a base material of the anisotropic conductive film is fluidized during thermo-compression bonding processing, a part of the conductive particles dispersed between the pair of conductors facing each other is pushed out in a gap between the adjacent conductors.

As a result, the conductive particles are concentrated in the gap between the adjacent conductors, such that the adjacent conductors may be short-circuited by the concentrated conductive particles.

In the vicinity of an edge of an insulation body such as an interlayer insulation layer, since a movement of the conductive particles is limited, excessive concentration of the conductive particles is increased. Therefore, there is a problem that the above-described short circuit phenomenon may easily occur particularly in the vicinity of the edge of such the insulation body.

Meanwhile, a demand for high definition is increased in a display apparatus. In order to meet the demand for such the high definition, it is necessary to narrow pitches of scanning signal lines, data signal lines, or the like as the conductors to be connected. In this case, since a distance between the signal lines adjacent to each other is reduced, the above-described short circuit problem becomes more serious.

In consideration of the above-mentioned circumstances, it is an object of the present invention to provide a connection structure of conductors in which notches are formed in a part of conductors to be connected, thereby, when connecting a pair of conductors facing each other using an anisotropic conductive film containing conductive particles dispersed therein, a short circuit between the adjacent conductors due to a movement of conductive particles may be restrained, and a display apparatus having the connection structure of conductors.

According to one embodiment of the present invention, there is provided a connection structure of conductors in which a plurality of first conductors formed in parallel on a first substrate and one end parts extending from an insulation body of a plurality of second conductors formed in parallel on a second substrate by covering with the insulation body are connected by an anisotropic conductive film containing conductive particles dispersed therein, comprising: notches which are formed in a portion of the first conductor corresponding to the one end part of the second conductor, and/or in the one end part of the second conductor.

According to the embodiment of the present invention, in the connection structure of conductors, the notches are formed in a connection portion of the first conductor and/or the second conductor, and in the portion in which the notches are formed, the first conductors adjacent to each other and/or the second conductors adjacent to each other are separated from each other at a larger interval than the other portions. Thereby, in the embodiment, even if the conductive particles contained in the anisotropic conductive film are aggregated in the portion in which the notches are formed, a distance between the first conductors adjacent to each other and/or a distance between the second conductors adjacent to each other are large, such that a short circuit due to the conductive particles aggregated therebetween does not occur.

In the connection structure of conductors according to the embodiment of the present invention, it is preferred that the notches are formed at a position which is the vicinity of an edge of the insulation body.

According to the preferred embodiment of the present invention, in the connection structure of conductors, the notches are formed in the vicinity of the edge of the insulation body in which the conductive particles are liable to be aggregated. Thereby, in the preferred embodiment, the short circuit is more reliably restrained.

In the connection structure of conductors according to the embodiment of the present invention, it is preferred that the first conductor and the second conductor include electrodes.

According to the preferred embodiment of the present invention, in the connection structure of conductors, the first conductor and the second conductor include the electrodes, and the notches are formed in a connection portion between the electrodes. Thereby, in the preferred embodiment, even if the conductive particles are aggregated in the portion in which the notches are formed, the distance between the electrodes adjacent to each other is large, such that the short circuit therebetween does not occur.

In the connection structure of conductors according to the embodiment of the present invention, it is preferred that the first conductor and the second conductor may include conductive layers.

According to the preferred embodiment of the present invention, in the connection structure of conductors, the first conductor and the second conductor include the conductive layers, and the notches are formed in a connection portion between the conductive layers. Thereby, in the preferred embodiment, even if the conductive particles are aggregated in the portion in which the notches are formed, the distance between the conductive layers adjacent to each other is large, such that the short circuit therebetween does not occur.

In the connection structure of conductors according to the embodiment of the present invention, it is preferred that the first conductor and the second conductor are provided with insulation films at peripheries thereof.

According to the preferred embodiment of the present invention, in the connection structure of conductors, the insulation films are provided at the peripheries of the first conductor and the second conductor. In the preferred embodiment, also in such the configuration, the short circuit between the conductors (electrodes and conductive layers) adjacent to each other is restrained.

According to another embodiment of the present invention, there is provided a display apparatus including: a display panel configured to display an image; a transmission body configured to transmit a signal for controlling an operation of the display panel; and the above-described connection structure of conductors which is provided between the display panel and the transmission body.

According to the display apparatus of the embodiment of the present invention, the above-described connection structure of conductors is used in an electrical connection between the display panel configured to display the image and the transmission body configured to transmit the signal for controlling the operation of the display panel. In the embodiment, a decrease in an overlapped area between the first conductor and the second conductor may be minimized by cutting a portion thereof, such that the display apparatus stably performs a display operation without resulting in a short circuit.

According to one embodiment of the present invention, the notches are formed in the portion of the first conductor and/or the second conductor corresponding to the region in which the conductive particles contained in the anisotropic conductive film are liable to be aggregated, such that a short circuit between the first conductors adjacent to each other and/or between the second conductors adjacent to each other due to the aggregation of the conductive particles may be restrained, and thereby leakage probability may be greatly reduced.

The above and further objects and features will more fully be apparent from the following detailed description with accompanying drawings.

BRIEF DESCRIPTION OF THE DRAWINGS

FIG. 1 is a perspective view illustrating a configuration of a connection structure of conductors.

DETAILED DESCRIPTION

Figure 2:
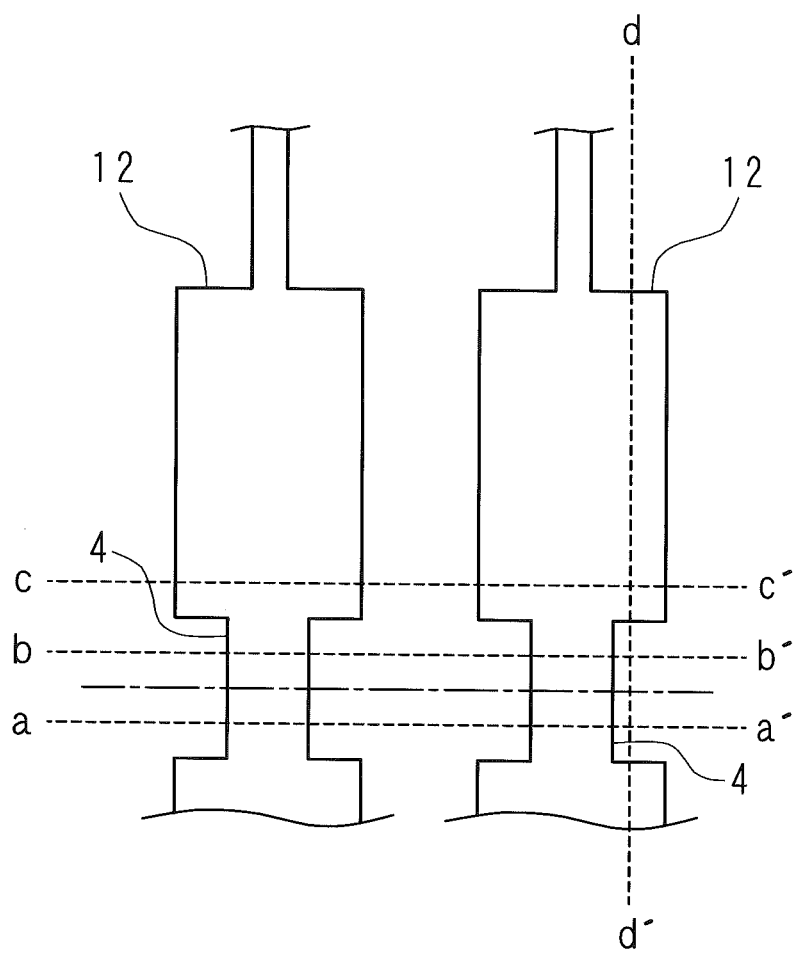
FIG. 2 is a plan view illustrating a shape of the conductors (first terminals) in an embodiment of the present invention according to an embodiment thereof.

Hereinafter, embodiments of the present invention will be described in detail with reference to the accompanying drawings illustrating embodiments thereof. FIG. 1 is a perspective view illustrating a configuration of a connection structure of conductors.

One object 1 to be connected in FIG. 1 has a flat rectangular parallelepiped support 11, and the support 11 includes a plurality of first terminals 12 formed thereon by patterning. The plurality of first terminals 12 are arranged in parallel with the same extending directions as each other. The object 1 includes a first conductive layer, a second conductive layer, electrodes, a semiconductor layer, and the like, which are formed therein. An insulation film is provided between the first conductive layer and the second conductive layer, and an interlayer insulation film is provided between the second conductive layer and the electrodes. As described below, the first terminal 12 has an electrode, a first conductive layer or a second conductive layer.

The other object 2 to be connected has a flat rectangular parallelepiped support 21, and the support 21 includes a plurality of second terminals 22 formed thereon by patterning. The plurality of second terminals 22 are arranged in parallel with the same extending directions as each other. Each second terminal 22 is covered with an insulation film 23 excluding a tip part thereof. Briefly, the tip parts of the second terminals 22 are in a state of extending from the insulation film 23. Each second terminal 22 faces each first terminal 12 to be connected corresponding thereto.

An anisotropic conductive film 3 is interposed between the first terminals 12 and the second terminals 22. The anisotropic conductive film 3 has a configuration in which conductive particles 32 including, for example, nickel particles are dispersed in an insulating adhesive 31 made of, for example, a thermosetting resin.

After positioning the first terminals 12 and the second terminals 22, which are to be connected, so as to face each other, the corresponding first terminals 12 and the second terminals 22 are electrically connected by executing thermocompression bonding processing. As an application example of such the electrical connection, there is an electrical connection provided between terminals (corresponding to the first terminals) provided in a display panel configured to display an image, and terminals (corresponding to the second terminals) provided in a transmission body configured to transmit a signal for controlling an operation of the display panel.

Figure 3:
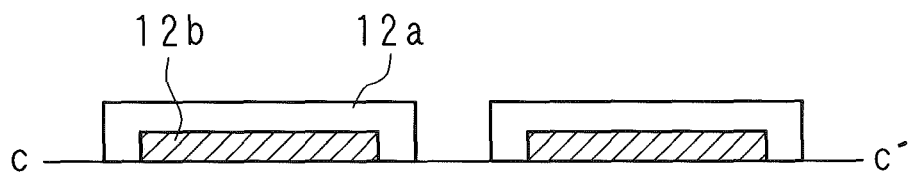
FIG. 3 is cross-sectional views taken on lines a-a', b-b', c-c', and d-d' of FIG. 2.
Figure 3:
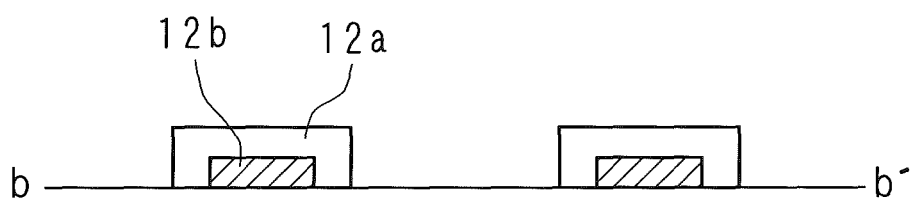
Figure 3:
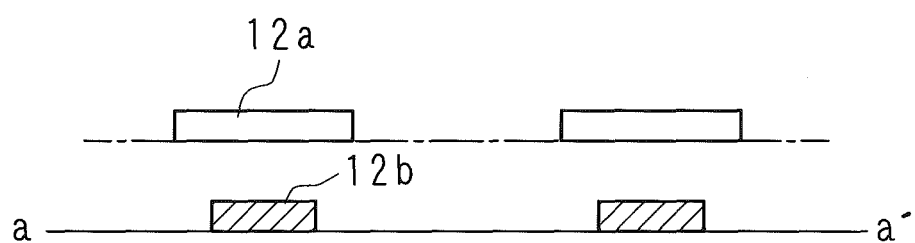
Figure 3:
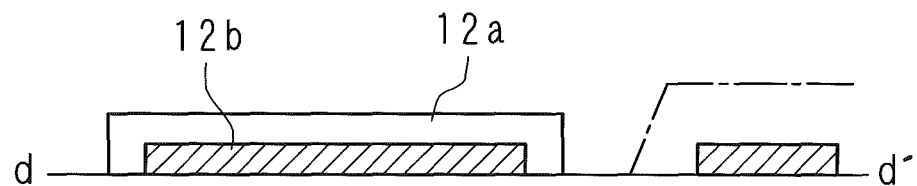

FIG. 2 is a plan view illustrating a shape of the conductors (the first terminals 12) in an embodiment of the present invention, and FIG. 3 is cross-sectional views taken on lines a-a', b-b', c-c', and d-d' of FIG. 2. When the first terminal 12 is a terminal for a data signal line in the display apparatus, for example, the first terminal has a terminal pitch of 49.0 µm, a terminal width of 35.0 µm, and a terminal interval of 14.0 µm.

As illustrated in FIG. 3, the first terminal 12 has an electrode 12a to be a pixel electrode, and a conductive layer 12b as a first conductive layer or a second conductive layer. The electrode 12a may be made of, for example, indium thin oxide (ITO), and the conductive layer 12b may be made of, for example, Cu/Ti.

Further, FIG. 2 illustrates a position of an edge of the interlayer insulation film by a one-dot chain line.

The first terminal 12 (electrode 12a and conductive layer 12b) of the embodiment of the present invention includes rectangular notches 4 formed in the vicinity of the edge of the interlayer insulation film. That is, a portion of each first extending terminal 12 which intersects the edge of the interlayer insulation film is cut. In particular, the notches 4 are formed on both sides of the first terminal 12 in a width direction thereof over a suitable length region in a longitudinal direction thereof about a position intersecting the edge of the interlayer insulation film.

Hereinafter, an effect of forming the notches 4 will be described in detail in comparison with a conventional example.

Figure 4:
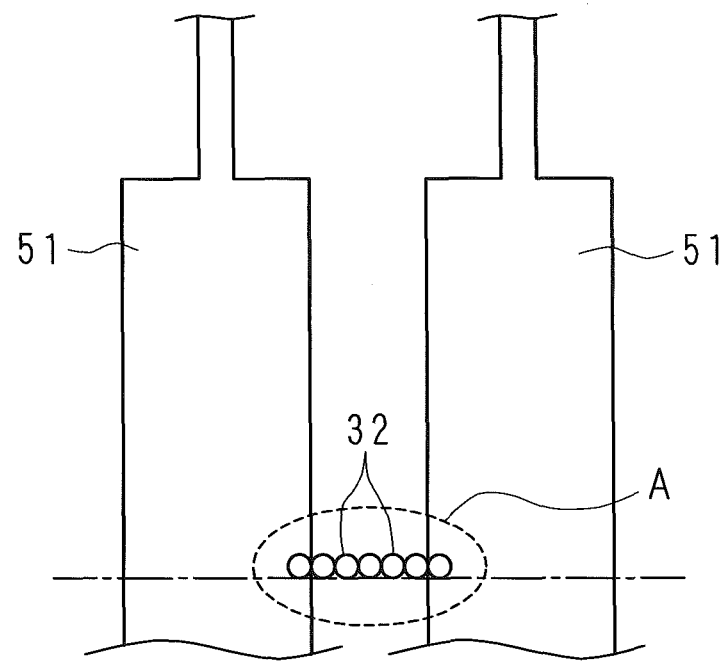
FIG. 4 is a view illustrating a shape of terminals and a state of conductive particles in a conventional example.

FIG. 4 is a view illustrating a shape of terminals and a state of conductive particles in the conventional example. Further, FIG. 4 illustrates a position of an edge of the interlayer insulation film by a one-dot chain line. In the conventional example, as illustrated in FIG. 4, a terminal 51 does not have a notch formed therein, and has a uniform width over the entire length thereof.

When executing thermo-compression bonding processing while interposing the anisotropic conductive film, the conductive particles 32 dispersed in the anisotropic conductive film are pushed out in a gap between the adjacent terminals 51, in the vicinity of the edge of the interlayer insulation film. Then, the conductive particles 32 are concentrated and continued between the adjacent terminals 51. As a result, the terminals 51 adjacent to each other are electrically conducted through the continued conductive particles 32, so as to be short-circuited (see a broken line A of FIG. 4).

Figure 5:
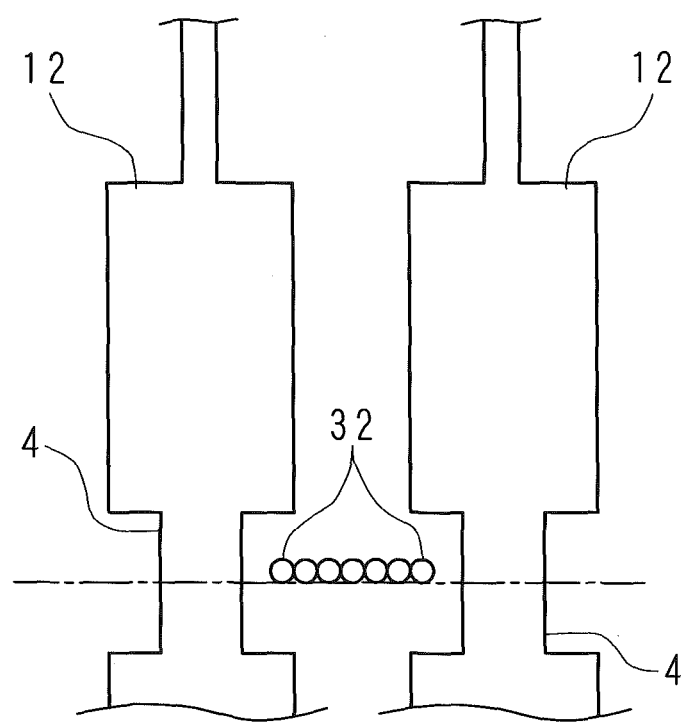
FIG. 5 is a view illustrating a shape of terminals and a state of conductive particles in the embodiment of the present invention.

Compared with this, in the embodiment of the present invention, since the notches 4 are formed, such the short circuit does not occur. FIG. 5 is a view illustrating a shape of terminals and a state of conductive particles in the embodiment of the present invention. Further, FIG. 5 illustrates a position of the edge of the interlayer insulation film by a one-dot chain line. In the embodiment of the present invention, as described above, the notches 4 are formed in the first terminals 12 (electrodes 12a and conductive layers 12b) at a position in the vicinity of the edge of the interlayer insulation film.

Also in the embodiment of the present invention, similar to the conventional example, when executing thermo-compression bonding processing while interposing the anisotropic conductive film 3, the conductive particles 32 dispersed in the anisotropic conductive film 3 are pushed out in a gap between the adjacent first terminals 12 (electrodes 12a and conductive layers 12b), in the vicinity of the edge of the insulation film 23. Then, the conductive particles 32 are concentrated and continued between the first terminals 12 (electrodes 12a and conductive layers 12b) adjacent to each other (see FIG. 5).

However, in the embodiment of the present invention, the notches 4 are formed in the first terminals 12 (electrodes 12a and conductive layers 12b) by matching with the region in which the conductive particles 32 are concentrated and continued. Accordingly, in the region, since a distance between the first terminals 12 (electrodes 12a and conductive layers 12b) adjacent to each other is increased, the continued conductive particles 32 do not reach the first terminals 12 (electrodes 12a and conductive layers 12b), and thereby the first terminals 12 (electrodes 12a and conductive layers 12b) adjacent to each other are not short-circuited.

As described above, in the embodiment of the present invention, since the notches are formed in the conductors to be connected, by associating with the region in which the conductive particles within the anisotropic conductive film are concentrated, even if an aggregation of the conductive particles occurs, it is possible to restrain the short circuit between the conductors adjacent to each other. As a result, it is possible to significantly reduce an occurrence rate of damage due to the short circuit. In addition, even when the pitch between the terminals is narrowed, by forming the notches in a predetermined region of the terminals, the short circuit between the terminals does not occur. Therefore, when the above-described configuration is applied to the display apparatus, it is possible to contribute to miniaturization of the display apparatus.

Further, in the embodiment illustrated in the above-described FIGS. 2 and 3, the case in which the first terminal 12 has the electrode 12a and the conductive layer 12b, and the notches 4 are formed in both of the electrode 12a and the conductive layer 12b has been described, but it may be configured in such a manner that the notch is formed in only one thereof.

Since the electrode 12a which is the uppermost layer of the first terminal 12 comes in contact with the anisotropic conductive film 3, it may be configured in such a manner that the notch 4 is formed in only the electrode 12a. In addition, as the next priority, the notch may also be formed in the conductive layer 12b (the first conductive layer and the second conductive layer).

Another embodiment of the present invention will be described. A configuration in which a periphery of the conductive layer to be connected is covered with an interlayer insulation film has been known in the art. When the conductive layer is made of, for example, Ti/Al/TiN, Al is exposed in a cross section of the conductive layer, such that the exposed Al is in contact with oxygen in the air so as to be corroded. To prevent this, the periphery of the conductive layer is covered with the interlayer insulation film.

Figure 6:
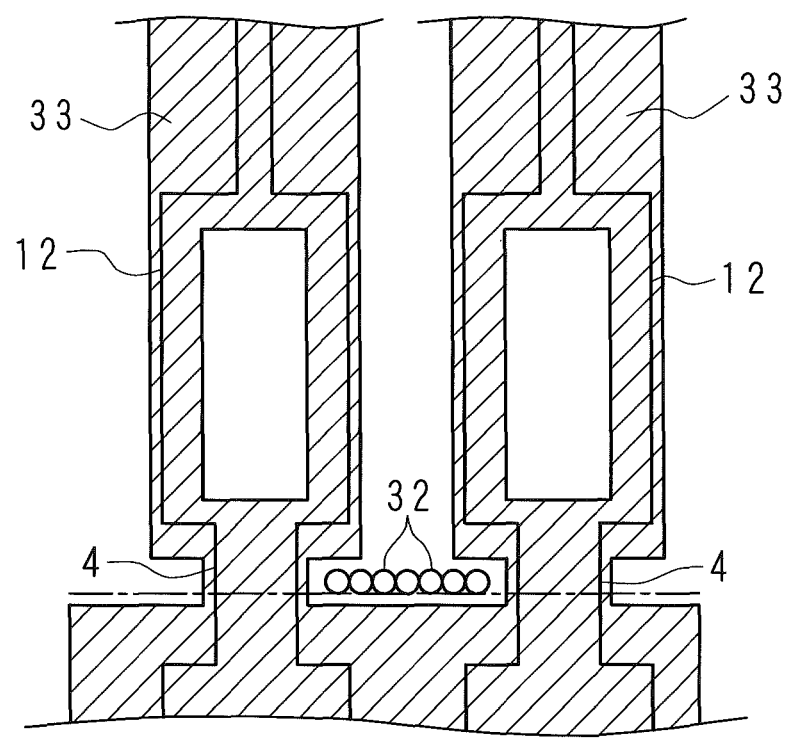
FIG. 6 is a plan view illustrating another embodiment in which the present invention is applied.

The present invention may be also applied to the above-described configuration. FIG. 6 is a plan view illustrating another embodiment in which the present invention is applied. The periphery of the conductive layer is covered with an interlayer insulation film 33. FIG. 6 illustrates a position of the edge of the interlayer insulation film 33 by a one-dot chain line. Similar to the above-described embodiments, rectangular notches 4 are formed in the first terminals 12 at a position in the vicinity of the edge of the interlayer insulation film 33.

Thereby, even if the conductive particles 32 dispersed in the anisotropic conductive film are concentrated and continued in the gap between the adjacent first terminals 12, in the vicinity of the edge of the interlayer insulation film 33

(see FIG. 6), since the distance between the first terminals 12 adjacent to each other is increased due to the notches 4 formed therein, the first terminals 12 adjacent to each other are not short-circuited.

Further, in the above-described embodiments, the case in which the insulation film to be provided with the notch is used as the interlayer insulation film has been described, but the present invention is not limited thereto. In the case in which terminals are configured so as to have steps which are formed so as to astride the terminals adjacent to each other in a direction orthogonal to the extending direction thereof, the terminals may be provided with the notches in accordance with other structures such as an insulation film between gate metal and source metal.

Furthermore, in the above-described embodiments, the notch 4 is formed so as to have a rectangular shape, but the shape of the notch 4 to be formed is not limited to the rectangular shape, and may be formed in other shapes. In addition, the notch 4 may have any size so long as it may exert a short-circuit prevention effect.

It is to be noted that, as used herein and in the appended claims, the singular forms "a", "an", and "the" include plural referents unless the context clearly dictates otherwise.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims

The invention claimed is:

1. A connection structure of conductors, comprising:
a plurality of first conductors formed in parallel on a first substrate,
a plurality of second conductors formed in parallel on a second substrate by covering with an insulation body, and
an anisotropic conductive film which contains conductive particles dispersed therein and connects the plurality of first conductors and one end parts extending from the insulation body of the plurality of second conductors,
wherein notches are formed in a portion of the first conductor which corresponds to the one end part of the second conductor and intersects an edge of an interlayer insulation film provided on the first substrate.

2. The connection structure of conductors according to claim 1,
wherein the first conductor and the second conductor include electrodes.

3. The connection structure of conductors according to claim 2, wherein the notches are formed in the electrode of the first conductor.

4. The connection structure of conductors according to claim 1,
wherein the first conductor and the second conductor include conductive layers.

5. A display apparatus, comprising:
a display panel configured to display an image;
a transmission body configured to transmit a signal for controlling an operation of the display panel; and
the connection structure of conductors according to claim 1 which is provided between the display panel and the transmission body.

6. The connection structure of conductors according to claim 1, wherein the notches are formed on both sides of the first conductor in a width direction of the first conductor over a predetermined length region in a longitudinal direction of the first conductor about a position intersecting the edge of the interlayer insulation film.

7. The connection structure of conductors according to claim 1, wherein the first conductor comprises an electrode and a conductive layer, and the notches are formed in the electrode and the conductive layer of the first conductor.

* * * * *